United States Patent
Fan (10) Patent No.: US 10,529,480 B2
(45) Date of Patent: Jan. 7, 2020

(54) ASYMMETRICAL T-COIL DESIGN FOR HIGH-SPEED TRANSMITTER IO ESD CIRCUIT APPLICATIONS

(71) Applicant: QUALCOMM Incorporated, San Diego, CA (US)

(72) Inventor: Siqi Fan, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 295 days.

(21) Appl. No.: 15/694,656

(22) Filed: Sep. 1, 2017

(65) Prior Publication Data
US 2019/0074129 A1 Mar. 7, 2019

(51) Int. Cl.
*H01F 27/28* (2006.01)
*H01F 27/29* (2006.01)
(Continued)

(52) U.S. Cl.
CPC ..... *H01F 27/2804* (2013.01); *H01F 17/0013* (2013.01); *H01F 27/29* (2013.01); *H01L 23/5227* (2013.01); *H01L 28/10* (2013.01); *H02H 9/046* (2013.01); *H01F 2017/0073* (2013.01); *H01F 2027/2809* (2013.01)

(58) Field of Classification Search
CPC ............... H01F 27/2804; H01F 27/29; H01F 2027/2809; H02H 9/046
See application file for complete search history.

(56) References Cited

U.S. PATENT DOCUMENTS 7,463,112 B1 * 12/2008 Groves .................... H03H 7/38
333/33
8,143,987 B2  3/2012 Kireev
(Continued)

OTHER PUBLICATIONS

Kim S., et al., "Design of a Reliable Broadband I/O Employing T-Coil", Journal of Semiconductor Technology and Science, Dec. 2009, vol. 9, No. 4, pp. 198-204.

*Primary Examiner* — Scott Bauer
(74) *Attorney, Agent, or Firm* — Holland & Hart LLP/Qualcomm (57) ABSTRACT

For a T-coil IC, a first inductor core is on an $M_x$ layer, has at least 1⅜ turns, and has a first-inductor-core-first end and a first-inductor-core-second end. A second inductor core is on an $M_{x-1}$ layer, has at least 2⅝ turns, and has a second-inductor-core-first end and a second-inductor-core-second end. The first-inductor-core-second end is connected to the second-inductor-core-first end at a node. A third inductor core is on an $M_{x-2}$ layer and has at least 3 turns. The third inductor core has a third-inductor-core-first end and a third-inductor-core-second end. The second-inductor-core-second end is connected to the third-inductor-core-first end. A tap is on an $M_{x-3-y}$ layer, where y≥0. The tap is connected to the first and second inductor cores at the node. A first inductor is formed by the first inductor core, and a second inductor is formed by the second and third inductor cores.

30 Claims, 5 Drawing Sheets

(51) Int. Cl.
*H02H 9/04* (2006.01)
*H01L 23/522* (2006.01)
*H01L 49/02* (2006.01)
*H01F 17/00* (2006.01)

(56) References Cited

U.S. PATENT DOCUMENTS

| | | |
|---|---|---|
| 8,395,234 B2 | 3/2013 | Okushima et al. |
| 9,048,017 B2 | 6/2015 | Kireev |
| 9,502,168 B1 | 11/2016 | Ler et al. |
| 9,508,480 B2 * | 11/2016 | Cho .................... H01F 17/0013 |
| 9,748,938 B2 * | 8/2017 | Kawai ..................... H04L 25/02 |
| 2005/0229126 A1 * | 10/2005 | Wang .................. G06F 17/5081 |
| | | 716/112 |
| 2006/0250198 A1 | 11/2006 | Meltzer et al. |
| 2011/0049672 A1 * | 3/2011 | Okushima ........... H01L 23/5227 |
| | | 257/531 |
| 2011/0133878 A1 * | 6/2011 | Chiu .................. H01F 17/0013 |
| | | 336/200 |
| 2012/0146741 A1 | 6/2012 | Yen et al. |
| 2012/0275074 A1 | 11/2012 | Dill et al. |
| 2014/0266434 A1 * | 9/2014 | Kireev ...................... H03F 3/04 |
| | | 330/250 |
| 2016/0078998 A1 | 3/2016 | Park et al. |
| 2016/0099301 A1 * | 4/2016 | Yen .................... H01L 23/5227 |
| | | 257/531 |
| 2016/0276091 A1 * | 9/2016 | Zhang ................. H01F 27/2804 |
| 2017/0076853 A1 * | 3/2017 | Valentin ............. H01F 27/2804 |
| 2017/0111995 A1 | 4/2017 | Nishikawa et al. |
| 2017/0365389 A1 * | 12/2017 | Yosui .................... H01F 41/071 |
| 2018/0006626 A1 * | 1/2018 | Lyalin ................. H01F 27/2804 |
| 2019/0074686 A1 | 3/2019 | Fan et al. |
| 2019/0074687 A1 | 3/2019 | Fan et al. |

* cited by examiner

ASYMMETRICAL T-COIL DESIGN FOR HIGH-SPEED TRANSMITTER IO ESD CIRCUIT APPLICATIONS

BACKGROUND

Field

The present disclosure relates generally to a T-coil design, and more particularly, to an asymmetrical T-coil design for high-speed transmitter input/output (IO) electrostatic discharge (ESD) circuit applications.

Background

As semiconductor integrated circuit (IC) device dimensions decrease and the operating speed of such ICs increases, devices/transistors on an IC become increasingly vulnerable to ESD. Use of a T-coil circuit (also referred to a T-coil network) may provide ESD protection to such devices/transistors. There is currently a need for improvements in the design of the T-coil circuit.

SUMMARY

In an aspect of the disclosure, a T-coil IC includes a first inductor core, a second inductor core, a third inductor core, and a tap. The first inductor core is on a metal x ($M_x$) layer. The first inductor core has at least 1⅜ turns. The first inductor core has a first inductor core first end and a first inductor core second end. The second inductor core is on a metal x−1 ($M_{x-1}$) layer. The second inductor core has at least 2⅝ turns. The second inductor core has a second inductor core first end and a second inductor core second end. The first inductor core second end is connected to the second inductor core first end at a node. The third inductor core is on a metal x−2 ($M_{x-2}$) layer. The third inductor core has at least 3 turns. The third inductor core has a third inductor core first end and a third inductor core second end. The second inductor core second end is connected to the third inductor core first end by a via. The tap is on a metal x−3−y ($M_{x-3-y}$) layer, where y is greater than or equal to 0. The tap is connected to the first inductor core and the second inductor core by a via stack at the node. A first inductor is formed by the first inductor core, and a second inductor is formed by the second inductor core and the third inductor core.

DETAILED DESCRIPTION

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known structures and components are shown in block diagram form in order to avoid obscuring such concepts. Apparatuses and methods will be described in the following detailed description and may be illustrated in the accompanying drawings by various blocks, modules, components, circuits, steps, processes, algorithms, elements, etc.

As device dimensions decrease and the operating speed of semiconductor ICs increases, devices/transistors on an IC become increasingly vulnerable to ESD. Use of a T-coil circuit may provide ESD protection to such devices/transistors (referred to herein as ESD devices). A T-coil circuit may also improve circuit performance by reducing high frequency signal loss due to ESD capacitance loading. On-chip ESD loading capacitances of high speed IO circuits reduce signal bandwidth. A T-coil device may be utilized with inductive peaking from two inductor cores (arms) of both sides of the T-coil to reduce high frequency signal loss due to ESD capacitance loading.

Figure 1:
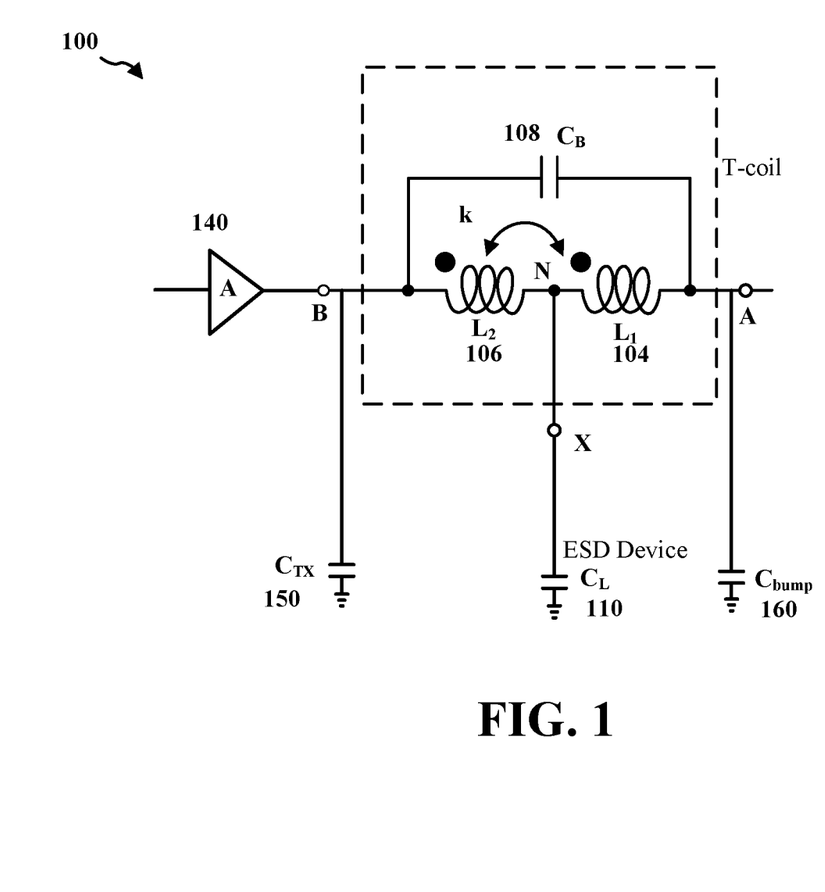
FIG. 1 is a diagram illustrating a T-coil circuit.

FIG. 1 is a diagram illustrating a T-coil circuit 100. As illustrated in FIG. 1, the T-coil circuit 100 includes a first inductor $L_1$ 104 connected between node A and node N and a second inductor $L_2$ 106 connected between node N and node B. The T-coil circuit 100 may further include a bridge capacitance $C_B$ 108. The bridge capacitance $C_B$ 108 may be provided by a bridge capacitor or through an intrinsic/plate-to-plate capacitance of the T-coil circuit 100. The intrinsic/plate-to-plate capacitance of the T-coil circuit 100 may be in overlapping coil portions of the first and second inductors $L_1$, $L_2$. The node N may be connected to an ESD device 110 with a capacitance $C_L$. The node B may be connected to an output of an amplifier 140. A capacitance at the output of the amplifier 140 on node B is $C_{TX}$ 150. The node A may be connected to an input/output pad with capacitance $C_{bump}$ 160. The T-coil circuit 100 has a magnetic coupling coefficient k (also referred to as a coupling factor) between the two coils of the first and second inductors $L_1$, $L_2$, where $k=(4\zeta^2-1)/(4\zeta^2+1)$ and $\zeta$ is a damping coefficient of the T-coil transfer function (the T-coil transfer function behaves like a $2^{nd}$ order lower pass filter and is equal to $V_x/I_A$—voltage at X divided by output current at A). The magnetic coupling coefficient k may be controlled through the damping coefficient $\zeta$. A magnetic coupling coefficient k of 0.5 may be best for group delay (output waveform identical to input waveform in the time domain), and a magnetic coupling coefficient k of 0.333 may be best for bandwidth extension. The T-coil may be designed such that the inductance L and the effective bridge capacitance $C_B$ minimizes return loss/reflections and improves the performance/bandwidth/group delay. In exemplary configurations, when $C_{TX}$ 150>>$C_{bump}$ 160, an asymmetrical T-coil 100 may be employed, where $L_2$>>$L_1$, for minimizing return loss/reflections and improving bandwidth extension at node A.

Figure 2:
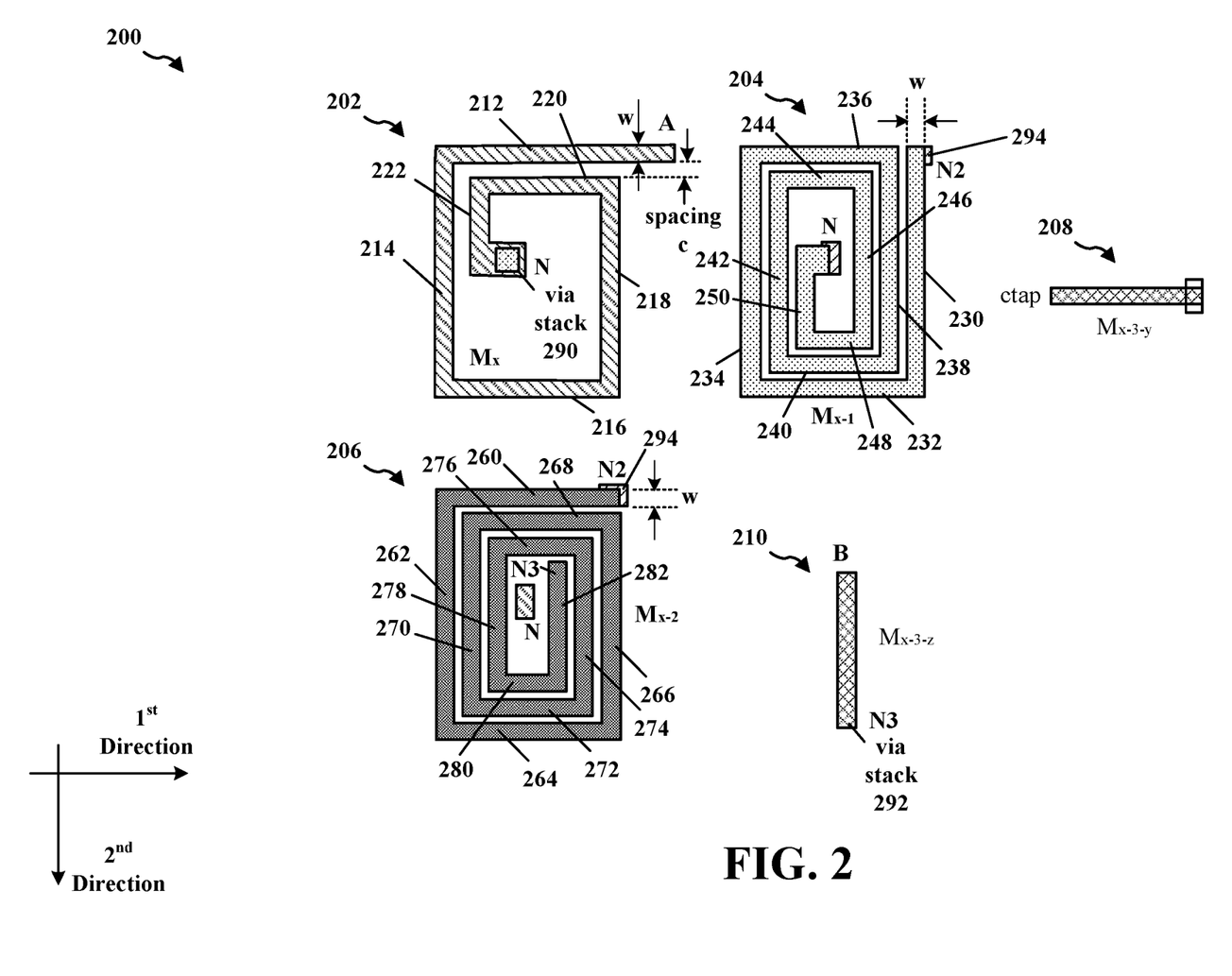
FIG. 2 is a diagram illustrating different layers of an exemplary T-coil IC.

FIG. 2 is a diagram 200 illustrating different layers of an exemplary T-coil IC. The exemplary T-coil IC includes a first inductor core 202 on a metal x ($M_x$) layer, a second inductor core 204 on a metal x−1 ($M_{x-1}$) layer, a third inductor core 206 on a metal x−2 ($M_{x-2}$) layer, and a tap 208 on a metal x−3−y ($M_{x-3-y}$) layer. The first inductor core 202 has a first inductor core first end at A and a first inductor core second end at node N. The first inductor core 202 has 1⅜ turns and includes segments 212, 214, 216, 218, 220, 222. As illustrated in FIG. 2, in a first configuration, the segments 212, 214, 216, 218, 220, 222 may have turns (may coil) in a counter-clockwise direction from A to node N. However, in a second configuration, the first inductor core 202 may have turns in a clockwise direction from A to node N. The second inductor core 204 has a second inductor core first end at node N and a second inductor core second end at node N2. The second inductor core 204 has 2⅝ turns and includes segments 230, 232, 234, 236, 238, 240, 242, 244, 246, 248, 250. As illustrated in FIG. 2, in a first configuration, the segments 230, 232, 234, 236, 238, 240, 242, 244, 246, 248, 250 may have turns (may coil) in a counter-clockwise direction from node N to node N2. However, in a second configuration, the second inductor core 204 may have turns in a clockwise direction from node N to node N2. The third inductor core 206 has a third inductor core first end at node N2 and a third inductor core second end at node N3. The third inductor core 206 has 3 turns and includes segments 260, 262, 264, 266, 268, 270, 272, 274, 276, 278, 280, 282. As illustrated in FIG. 2, in a first configuration, the segments 260, 262, 264, 266, 268, 270, 272, 274, 276, 278, 280, 282 may have turns (may coil) in a counter-clockwise direction from node N2 to node N3. However, in a second configuration, the third inductor core 206 may have turns in a clockwise direction from node N2 to node N3.

The first inductor core 202 and the second inductor core 204 are connected at node N by a via $V_{x-1}$ between the $M_{x-1}$ and $M_x$ layers. Specifically, the first inductor core second end at node N is connected to the second inductor core first end at node N by a via $V_{x-1}$ between the $M_{x-1}$ and $M_x$ layers. The via $V_{x-1}$ is part of a via stack 290. The second inductor core 204 and the third inductor core 206 are connected at node N2 by a via $V_{x-2}$ 294 between the $M_{x-2}$ and $M_{x-1}$ layers. Specifically, the second inductor core second end at node N2 is connected to the third inductor core first end at node N2 by a via $V_{x-2}$ 294 between the $M_{x-2}$ and $M_{x-1}$ layers. An output interconnect 210 is on a metal x−3−z ($M_{x-3-z}$) layer, where z is an integer and is greater than or equal to 0. The output interconnect 210 is connected to the third inductor core 206 at node N3 by a via stack 292 between the $M_{x-3-z}$ layer and the $M_{x-2}$ layer. Such a via stack 292 would include alternating layers of metal interconnects and vias between the $M_{x-2}$ layer and the $M_{x-3-z}$ layer. For example, assuming z equals 3, the via stack 292 would include an $M_{x-2}$ layer interconnect (third inductor core 206 at node N3), via $V_{x-3}$, an $M_{x-3}$ layer interconnect, via $V_{x-4}$, an $M_{x-4}$ layer interconnect, via $V_{x-5}$, an $M_{x-5}$ layer interconnect, via $V_{x-6}$, and an $M_{x-6}$ layer interconnect (output interconnect 210 at node N3)). The output on the output interconnect 210 is labeled B. In one example, z is equal to 0, 1, 2, or 3. On which metal layer the output interconnect 210 is located may be based on a thickness of metal layers below the $M_{x-2}$ layer. When metal layers below the $M_{x-2}$ layer are too thin to handle the current flowing through the output interconnect 210, the via stack 292 at node N3 may include more metal layers (e.g., z may be equal to 2 or 3). When metal layers below the $M_{x-2}$ layer are sufficiently thick to handle the current flowing through the output interconnect 210, the via stack 292 at node N3 may include less metal layers (e.g., z may be equal to 0 or 1).

The tap 208 is on the $M_{x-3-y}$ layer, where y is an integer and greater than or equal to 0. The tap 208 is connected to the first inductor core 202 and the second inductor core 204 by the via stack 290 at the node N. The via stack 290 extends between the $M_x$ layer and the $M_{x-3-y}$ layer. Such a via stack 290 would include alternating layers of metal interconnects and vias between the $M_x$ layer and the $M_{x-3-y}$ layer. For example, assuming y equals 3, the via stack 290 would include an $M_x$ layer interconnect (first inductor core 202 at node N), via $V_{x-1}$, $M_{x-1}$ layer interconnect (second inductor core 204 at node N), via $V_{x-2}$, $M_{x-2}$ layer interconnect, via $V_{x-3}$, an $M_{x-3}$ layer interconnect, via $V_{x-4}$, an $M_{x-4}$ layer interconnect, via $V_{x-5}$, an $M_{x-5}$ layer interconnect, via $V_{x-6}$, and an $M_{x-6}$ layer interconnect (tap 208 at node N)). In one example, y is equal to 0, 1, 2, or 3. On which metal layer the tap 208 is located may be based on a thickness of metal layers below the $M_{x-2}$ layer. When metal layers below the $M_{x-2}$ layer are too thin to handle the current flowing through the tap 208, the via stack 290 at node N may include more metal layers (e.g., y may be equal to 2 or 3). When metal layers below the $M_{x-2}$ layer are sufficiently thick to handle the current flowing through the tap 208, the via stack 290 at node N may include less metal layers (e.g., y may be equal to 0 or 1).

A first inductor $L_1$ is formed by the first inductor core 202, and a second inductor $L_2$ is formed by the second inductor core 204 and the third inductor core 206. In one configuration, the first inductor core 202 is on a redistribution layer (RDL), the second inductor core 204 is one layer below the RDL, and the third inductor core 206 is two layers below the RDL. The thickness of the first inductor core 202 (e.g., 2.8 μm) on the $M_x$ layer/RDL may be thicker than the second and third inductor cores 204, 206 (e.g., 1.2 μm-1.25 μm) on the $M_{x-1}$ and $M_{x-2}$ layers. The line width w for the first, second, and third inductor cores 202, 204, 206 and the spacing c between turns of the first inductor core 202 on the $M_x$ layer, the second inductor core 204 on the $M_{x-1}$ layer, and the third inductor core 206 on the $M_{x-2}$ layer may be approximately the same. For example, the line width w of the first, second, and third inductor cores 202, 204, 206 may be 2 μm and the spacing c between neighboring turns for the first, second, and third inductor cores 202, 204, 206 may be 1.8 μm.

Figure 3:
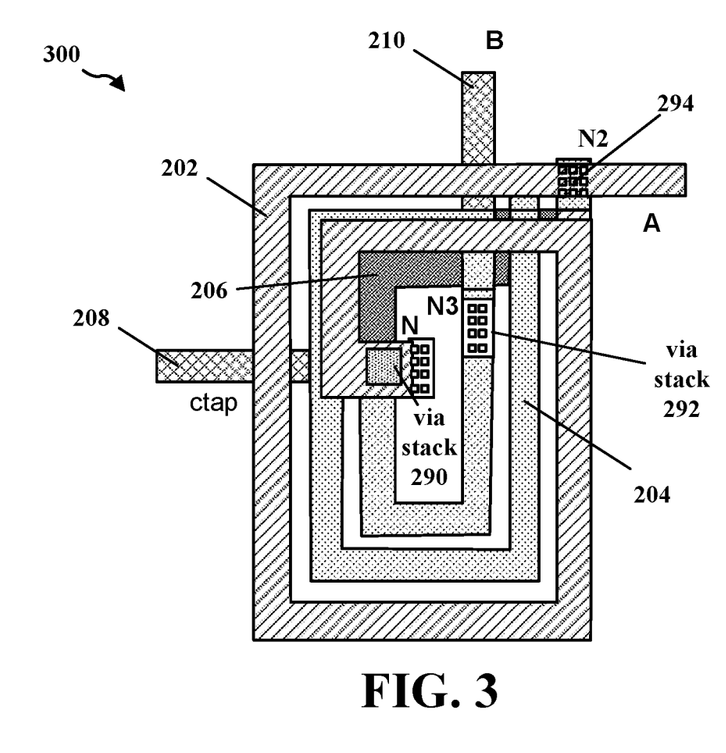
FIG. 3 is a diagram illustrating a plan view of the exemplary T-coil IC.
Figure 4:
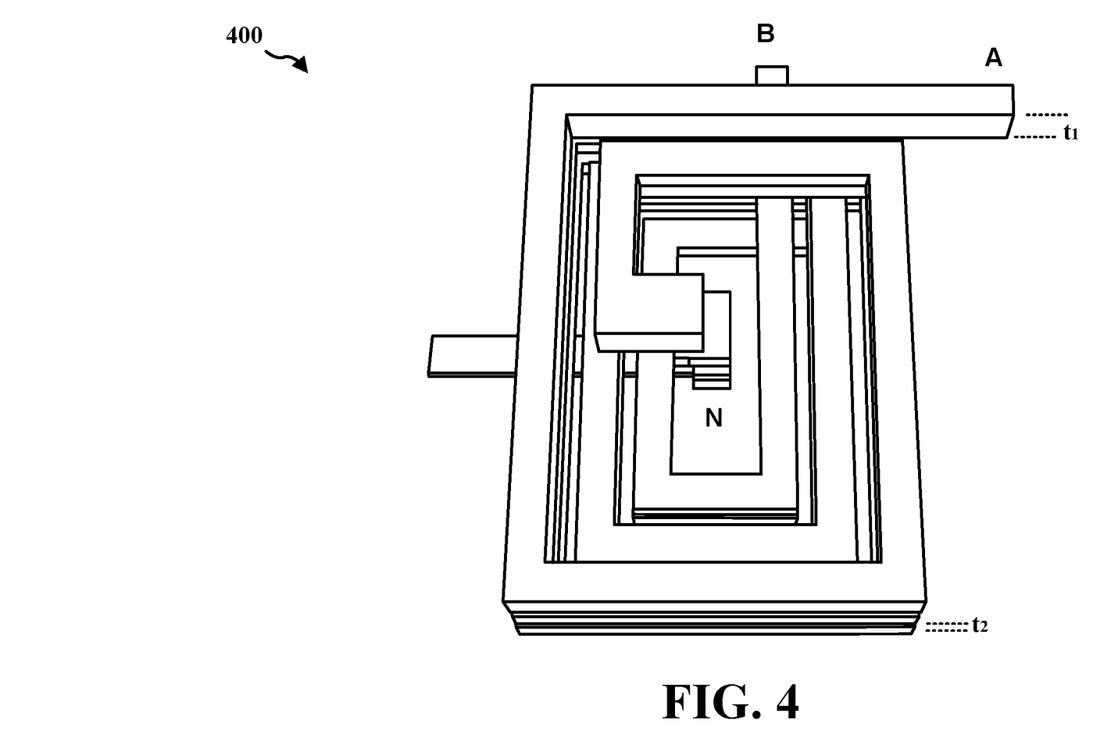
FIG. 4 is a diagram illustrating a 3-dimensional (3D) view of the exemplary T-coil IC.

FIG. 3 is a diagram 300 illustrating a plan view of the exemplary T-coil IC. FIG. 4 is a diagram 400 illustrating a 3D view of the exemplary T-coil IC. As illustrated in FIGS. 3, 4, the first inductor core 202 overlays the second inductor core 204, and the second inductor core 204 overlays the third inductor core 206. The first inductor core 202 and the second inductor core 204 are connected together through a via stack 290 at node N between the $M_x$ and $M_{x-3-y}$ layers. The tap 208 on the $M_{x-3-y}$ layer is connected to the via stack 290 at the node N. Accordingly, the tap 208 is connected to the first and second inductor cores 202, 204 and the node N. The second inductor core 204 and the third inductor core 206 are connected together through a via 294 at node N2. As discussed supra, the thickness $t_1$ of the first inductor core 202 (e.g., 2.8 μm) on the $M_x$ layer/RDL may be greater than a thickness $t_2$ of the second and third inductor cores 204, 206 (e.g., 1.2 μm-1.25 μm) on the $M_{x-1}$ and $M_{x-2}$ layers, respectively.

As discussed supra, the $M_x$ layer may be an RDL. The $M_{x-1}$ layer is one layer below the RDL and the $M_{x-2}$ layer is two layers below the RDL. Assuming there are 15 layers below the RDL, then the $M_{x-1}$ layer would be an $M_{15}$ layer and the $M_{x-2}$ layer would be an $M_{14}$ layer. A first inductor $L_1$ is formed by the first inductor core 202 and a second inductor $L_2$ is formed by the second and third inductor cores 204, 206. The first inductor $L_1$ has a first inductance and the second inductor $L_2$ has a second inductance. A ratio of the first inductance of the first inductor $L_1$ to the second inductance of the second inductor $L_2$ may be approximately 1 to 7.5. A coupling coefficient k of the T-coil may be approximately 0.4. As illustrated in FIGS. 2, 3, 4, the T-coil IC is square shaped. However, the T-coil IC may be rectangular, octagonal, or circular.

Referring again to FIGS. 1-4, a T-coil IC includes a first inductor core 202, a second inductor core 204, a third inductor core 206, and a tap 208. The first inductor core 202 is on an $M_x$ layer. The first inductor core 202 has at least 1⅜ turns. The first inductor core 202 has a first inductor core first end at A and a first inductor core second end at node N. The second inductor core 204 is on an $M_{x-1}$ layer. The second inductor core 204 has at least 2⅝ turns. The second inductor core 204 has a second inductor core first end at node N and a second inductor core second end at node N2. The first inductor core second end at node N is connected to the second inductor core first end at node N by a via stack 290 at a node N. The third inductor core 206 is on an $M_{x-2}$ layer. The third inductor core 206 has at least 3 turns. The third inductor core 206 has a third inductor core first end at node N2 and a third inductor core second end at node N3. The second inductor core second end at node N2 is connected to the third inductor core first end at node N2 by a via $V_{x-2}$ 294. The tap 208 is on an $M_{x-3-y}$ layer, where y is an integer greater than or equal to 0. The tap 208 is connected to the first inductor core 202 and the second inductor core 204 by the via stack 290 at the node N. An (output) interconnect 210 on an $M_{x-3-z}$ layer, where z is an integer greater than or equal to 0, may be connected to the third inductor core second end at node N3 by a via stack 292 at node N3. A first inductor $L_1$ is formed by the first inductor core 202, and a second inductor $L_2$ is formed by the second inductor core 204 and the third inductor core 206.

In one configuration, the first inductor core 202 has 1⅜ turns, the second inductor core 204 has 2⅝ turns, and the third inductor core 206 has 3 turns. In one configuration, y is equal to one of 0, 1, 2, or 3. In one configuration, the first inductor core 202, the second inductor core 204, and the third inductor core 206 each include segments that extend in a first direction and in a second direction orthogonal to the first direction. The segments 212, 236, 260 at an edge of the first inductor core 202, the second inductor core 204, and the third inductor core 206 that extend in the first direction completely overlay each other. The segments 216, 232, 264 at an edge of the first inductor core 202, the second inductor core 204, and the third inductor core 206 that extend in the first direction completely overlay each other. The segments 214, 234, 262 at an edge of the first inductor core 202, the second inductor core 204, and the third inductor core 206 that extend in the second direction completely overlay each other. The segments 218, 230, 266 at an edge of the first inductor core 202, the second inductor core 204, and the third inductor core 206 that extend in the second direction completely overlay each other.

In one configuration, the first inductor core 202 includes a first inductor core first segment 212 extending in a first direction, a first inductor core second segment 214 connected to the first inductor core first segment 212 and extending in a second direction, a first inductor core third segment 216 connected to the first inductor core second segment 214 and extending in the first direction, a first inductor core fourth segment 218 connected to the first inductor core third segment 216 and extending in the second direction, a first inductor core fifth segment 220 connected to the first inductor core fourth segment 218 and extending in the first direction, and a first inductor core sixth segment 222 connected to the first inductor core fifth segment 220 and extending in the second direction. In one configuration, the second inductor core 204 includes a second inductor core first segment 230 extending in the second direction, a second inductor core second segment 232 connected to the second inductor core first segment 230 and extending in the first direction, a second inductor core third segment 234 connected to the second inductor core second segment 232 and extending in the second direction, a second inductor core fourth segment 236 connected to the second inductor core third segment 234 and extending in the first direction, a second inductor core fifth segment 238 connected to the second inductor core fourth segment 236 and extending in the second direction, a second inductor core sixth segment 240 connected to the second inductor core fifth segment 238 and extending in the first direction, a second inductor core seventh segment 242 connected to the second inductor core sixth segment 240 and extending in the second direction, a second inductor core eighth segment 244 connected to the second inductor core seventh segment 242 and extending in the first direction, a second inductor core ninth segment 246 connected to the second inductor core eighth segment 244 and extending in the second direction, a second inductor core tenth segment 248 connected to the second inductor core ninth segment 246 and extending in the first direction, and a second inductor core eleventh segment 250 connected to the second inductor core tenth segment 248 and extending in the second direction.

In one configuration, the first inductor core first segment 212 primarily overlays the second inductor core fourth segment 236, the first inductor core second segment 214 primarily overlays the second inductor core third segment 234, the first inductor core third segment 216 primarily overlays the second inductor core second segment 232, the first inductor core fourth segment 218 primarily overlays the second inductor core first segment 230, the first inductor core fifth segment 220 primarily overlays the second inductor core eighth segment 244, and the first inductor core sixth segment 222 primarily overlays the second inductor core seventh segment 242.

In one configuration, the third inductor core 206 includes a third inductor core first segment 260 extending in the first direction, a third inductor core second segment 262 connected to the third inductor core first segment 260 and extending in the second direction, a third inductor core third segment 264 connected to the third inductor core second segment 262 and extending in the first direction, a third inductor core fourth segment 266 connected to the third inductor core third segment 264 and extending in the second direction, a third inductor core fifth segment 268 connected to the third inductor core fourth segment 266 and extending in the first direction, a third inductor core sixth segment 270 connected to the third inductor core fifth segment 268 and extending in the second direction, a third inductor core seventh segment 272 connected to the third inductor core sixth segment 270 and extending in the first direction, a third inductor core eighth segment 274 connected to the third inductor core seventh segment 272 and extending in the second direction, a third inductor core ninth segment 276 connected to the third inductor core eighth segment 274 and extending in the first direction, a third inductor core tenth segment 278 connected to the third inductor core ninth segment 276 and extending in the second direction, a third inductor core eleventh segment 280 connected to the third inductor core tenth segment 278 and extending in the first direction, and a third inductor core twelfth segment 282 connected to the third inductor core eleventh segment 280 and extending in the second direction.

In one configuration, the second inductor core first segment 230 primarily overlays the third inductor core fourth segment 266, the second inductor core second segment 232 primarily overlays the third inductor core third segment 264, the second inductor core third segment 234 primarily overlays the third inductor core second segment 262, the second inductor core fourth segment 236 primarily overlays the third inductor core first segment 260, the second inductor core fifth segment 238 primarily overlays the third inductor core eighth segment 274, the second inductor core sixth segment 240 primarily overlays the third inductor core seventh segment 272, the second inductor core seventh segment 242 primarily overlays the third inductor core sixth segment 270, the second inductor core eighth segment 244 primarily overlays the third inductor core fifth segment 268, the second inductor core ninth segment 246 primarily overlays the third inductor core twelfth segment 282, the second inductor core tenth segment 248 primarily overlays the third inductor core eleventh segment 280, and the second inductor core eleventh segment 250 primarily overlays the third inductor core tenth segment 278.

In one configuration, the $M_x$ layer is an RDL. In one configuration, the layer is an $M_{15}$ layer, and the $M_{x-2}$ layer is an $M_{14}$ layer. In one configuration, the T-coil IC is on an IC, and the tap 208 is connected to an ESD device on the IC. In one configuration, a ratio of a first inductance of the first inductor $L_1$ to a second inductance of the second inductor $L_2$ is approximately 1 to 7.5. In one configuration, a coupling coefficient k of the T-coil is approximately 0.4.

Figure 5:
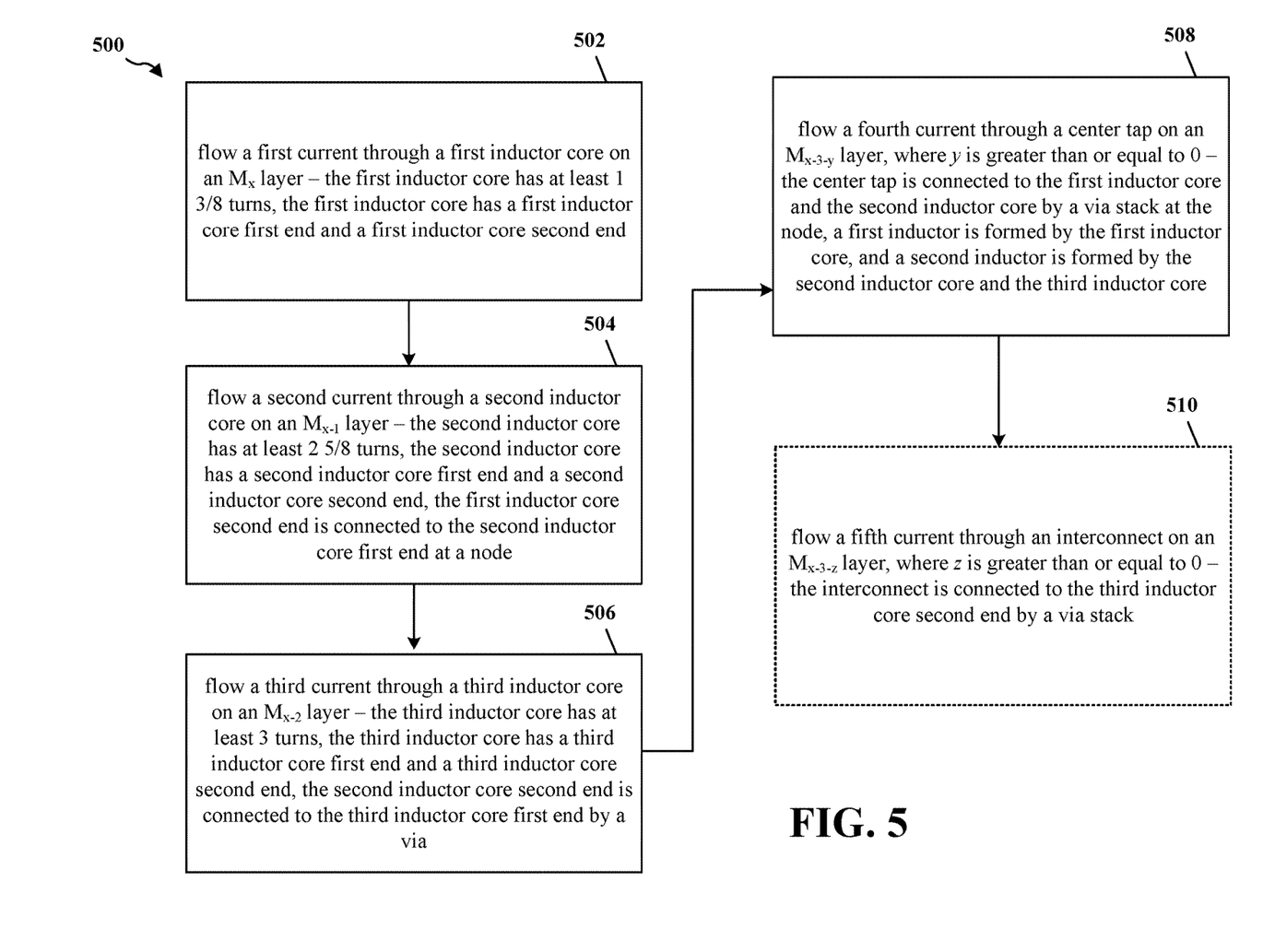
FIG. 5 is a diagram illustrating a method of operation of the exemplary T-coil IC.

FIG. 5 is a diagram 500 illustrating a method of operation of the exemplary T-coil IC. At 502, a first current flows through a first inductor core 202 on an $M_x$ layer. The first inductor core 202 has at least 1⅜ turns. The first inductor core 202 has a first inductor core first end at A and a first inductor core second end at node N. At 504, a second current flows through a second inductor core 204 on an $M_{x-1}$ layer. The second inductor core 204 has at least 2⅝ turns. The second inductor core 204 has a second inductor core first end at node N and a second inductor core second end and node N2. The first inductor core second end at node N is connected to the second inductor core first end at node N by a via stack 290 at a node N. At 506, a third current flows through a third inductor core 206 on an $M_{x-2}$ layer. The third inductor core 206 has at least 3 turns. The third inductor core 206 has a third inductor core first end at node N2 and a third inductor core second end at node N3. The second inductor core second end at node N2 is connected to the third inductor core first end at node N2 by a via 294. At 508, a fourth current flows through a tap 208 on an $M_{x-3-y}$ layer, where y is an integer greater than or equal to 0. The tap 208 is connected to the first inductor core 202 and the second inductor core 204 by the via stack 290 at the node N. A first inductor $L_1$ is formed by the first inductor core 202, and a second inductor $L_2$ is formed by the second inductor core 204 and the third inductor core 206. At 510, a fifth current may flow through an (output) interconnect 210 on an $M_{x-3-z}$ layer, where z is an integer greater than or equal to 0. The interconnect 210 is connected to the third inductor core second end at node N3 by a via stack 292 at the node N3.

In one configuration, a T-coil IC includes means for flowing a first current through a first inductor core 202 on an $M_x$ layer. The first inductor core 202 has at least 1⅜ turns. The first inductor core 202 has a first inductor core first end at A and a first inductor core second end at node N. The T-coil IC further includes means for flowing a second current through a second inductor core 204 on an $M_{x-1}$ layer. The second inductor core 204 has at least 2⅝ turns. The second inductor core 204 has a second inductor core first end at node N and a second inductor core second end at node N2. The first inductor core second end at node N is connected to the second inductor core first end at node N by a via stack 290 at a node N. The T-coil IC further includes means for flowing a third current through a third inductor core 206 on an $M_{x-2}$ layer. The third inductor core 206 has at least 3 turns. The third inductor core 206 has a third inductor core first end at node N2 and a third inductor core second end at node N3. The second inductor core second end at node N2 is connected to the third inductor core first end at node N2 by a via 294. The T-coil IC further includes means for flowing a fourth current through a tap 208 on an $M_{x-3-y}$ layer, where y is an integer greater than or equal to 0. The tap 208 is connected to the first inductor core 202 and the second inductor core 204 by the via stack 290 at the node N. A first inductor $L_1$ is formed by the first inductor core 202, and a second inductor $L_2$ is formed by the second inductor core 204 and the third inductor core 206. The T-coil IC may further include means for flowing a fifth current through an (output) interconnect 210 on an $M_{x-3-z}$ layer, where z is an integer greater than or equal to 0. The interconnect 210 is connected to the third inductor core second end at node N3 by a via stack 292 at the node N3. An output on the interconnect 210 is at B.

Referring again to FIGS. 1-5, the exemplary T-coil IC provides a first inductor $L_1$ through a first inductor core 202 on an $M_x$ layer, and provides a second inductor $L_2$ through a second inductor core 204 and a third inductor core 206 on an layer and an $M_{x-2}$ layer, respectively. The $M_x$ layer may be an RDL, whereas the $M_{x-1}$ layer may be one metal layer below the RDL and the $M_{x-2}$ layer may be two metal layers below the RDL. The inductance ratio of $L_1/L_2$ may be approximately 1/7.5. A coupling coefficient k of the exemplary T-coil IC may be approximately 0.4, which is good for bandwidth extension. Dimensions of the exemplary T-coil IC may be approximately 20 μm×30 μm.

It is understood that the specific order or hierarchy of steps in the processes disclosed is an illustration of exemplary approaches. Based upon design preferences, it is understood that the specific order or hierarchy of steps in the processes may be rearranged. Further, some steps may be combined or omitted. The accompanying method claims present elements of the various steps in a sample order, and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." The word "exemplary" is used herein to mean "serving as an example, instance, or illustration." Any aspect described herein as "exemplary" is not necessarily to be construed as preferred or advantageous over other aspects." Unless specifically stated otherwise, the term "some" refers to one or more. Combinations such as "at least one of A, B, or C," "at least one of A, B, and C," and "A, B, C, or any combination thereof" include any combination of A, B, and/or C, and may include multiples of A, multiples of B, or multiples of C. Specifically, combinations such as "at least one of A, B, or C," "at least one of A, B, and C," and "A, B, C, or any combination thereof" may be A only, B only, C only, A and B, A and C, B and C, or A and B and C, where any such combinations may contain one or more member or members of A, B, or C. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed as a means plus function unless the element is expressly recited using the phrase "means for."

What is claimed is:

1. A T-coil integrated circuit (IC), comprising:
  a first inductor core on a metal x ($M_x$) layer, the first inductor core having at least 1⅜ turns, the first inductor core having a first inductor core first end and a first inductor core second end;
  a second inductor core on a metal x−1 ($M_{x-1}$) layer, the second inductor core having at least 2⅝ turns, the second inductor core having a second inductor core first end and a second inductor core second end, the first inductor core second end being connected to the second inductor core first end at a node;
  a third inductor core on a metal x−2 ($M_{x-2}$) layer, the third inductor core having at least 3 turns, the third inductor core having a third inductor core first end and a third inductor core second end, the second inductor core second end being connected to the third inductor core first end by a via; and
  a tap on a metal x−3−y ($M_{x-3-y}$) layer, where y is greater than or equal to 0, the tap being connected to the first inductor core and the second inductor core by a via stack at the node, wherein a first inductor is formed by the first inductor core, and a second inductor is formed by the second inductor core and the third inductor core.

2. The T-coil IC of claim 1, wherein the first inductor core as 1⅜ turns, the second inductor core has 2⅝ turns, and the third inductor core has 3 turns.

3. The T-coil IC of claim 1, wherein y is equal to one of 0, 1, 2, or 3.

4. The T-coil IC of claim 1, wherein the first inductor core, the second inductor core, and the third inductor core each comprises segments that extend in a first direction and in a second direction orthogonal to the first direction, and wherein the segments at an edge of the first inductor core, the second inductor core, and the third inductor core that extend in the first direction completely overlay each other, and the segments at an edge of the first inductor core, the second inductor core, and the third inductor core that extend in the second direction completely overlay each other.

5. The T-coil IC of claim 1, wherein the first inductor core comprises a first inductor core first segment extending in a first direction, a first inductor core second segment connected to the first inductor core first segment and extending in a second direction, a first inductor core third segment connected to the first inductor core second segment and extending in the first direction, a first inductor core fourth segment connected to the first inductor core third segment and extending in the second direction, a first inductor core fifth segment connected to the first inductor core fourth segment and extending in the first direction, and a first inductor core sixth segment connected to the first inductor core fifth segment and extending in the second direction.

6. The T-coil IC of claim 5, wherein the second inductor core comprises a second inductor core first segment extending in the second direction, a second inductor core second segment connected to the second inductor core first segment and extending in the first direction, a second inductor core third segment connected to the second inductor core second segment and extending in the second direction, a second inductor core fourth segment connected to the second inductor core third segment and extending in the first direction, a second inductor core fifth segment connected to the second inductor core fourth segment and extending in the second direction, a second inductor core sixth segment connected to the second inductor core fifth segment and extending in the first direction, a second inductor core seventh segment connected to the second inductor core sixth segment and extending in the second direction, a second inductor core eighth segment connected to the second inductor core seventh segment and extending in the first direction, a second inductor core ninth segment connected to the second inductor core eighth segment and extending in the second direction, a second inductor core tenth segment connected to the second inductor core ninth segment and extending in the first direction, and a second inductor core eleventh segment connected to the second inductor core tenth segment and extending in the second direction.

7. The T-coil IC of claim 6, wherein the first inductor core first segment primarily overlays the second inductor core fourth segment, the first inductor core second segment primarily overlays the second inductor core third segment, the first inductor core third segment primarily overlays the second inductor core second segment, the first inductor core fourth segment primarily overlays the second inductor core first segment, the first inductor core fifth segment primarily overlays the second inductor core eighth segment, and the first inductor core sixth segment primarily overlays the second inductor core seventh segment.

8. The T-coil IC of claim 6, wherein the third inductor core comprises a third inductor core first segment extending in the first direction, a third inductor core second segment connected to the third inductor core first segment and extending in the second direction, a third inductor core third segment connected to the third inductor core second segment and extending in the first direction, a third inductor core fourth segment connected to the third inductor core third segment and extending in the second direction, a third inductor core fifth segment connected to the third inductor core fourth segment and extending in the first direction, a third inductor core sixth segment connected to the third inductor core fifth segment and extending in the second direction, a third inductor core seventh segment connected to the third inductor core sixth segment and extending in the first direction, a third inductor core eighth segment connected to the third inductor core seventh segment and extending in the second direction, a third inductor core ninth segment connected to the third inductor core eighth segment and extending in the first direction, a third inductor core tenth segment connected to the third inductor core ninth segment and extending in the second direction, a third inductor core eleventh segment connected to the third inductor core tenth segment and extending in the first direction, and a third inductor core twelfth segment connected to the third inductor core eleventh segment and extending in the second direction.

9. The T-coil IC of claim 8, wherein the second inductor core first segment primarily overlays the third inductor core fourth segment, the second inductor core second segment primarily overlays the third inductor core third segment, the second inductor core third segment primarily overlays the third inductor core second segment, the second inductor core fourth segment primarily overlays the third inductor core first segment, the second inductor core fifth segment primarily overlays the third inductor core eighth segment, the second inductor core sixth segment primarily overlays the third inductor core seventh segment, the second inductor core seventh segment primarily overlays the third inductor core sixth segment, the second inductor core eighth segment primarily overlays the third inductor core fifth segment, the second inductor core ninth segment primarily overlays the third inductor core twelfth segment, the second inductor core tenth segment primarily overlays the third inductor core eleventh segment, and the second inductor core eleventh segment primarily overlays the third inductor core tenth segment.

10. The T-coil IC of claim 1, wherein the $M_x$ layer is a redistribution layer (RDL).

11. The T-coil IC of claim 10, wherein the $M_{x-1}$ layer is an $M_{15}$ layer, and the $M_{x-2}$ layer is an $M_{14}$ layer.

12. The T-coil IC of claim 1, wherein the T-coil IC is on an IC, and the tap is connected to an electrostatic discharge (ESD) device on the IC.

13. The T-coil IC of claim 1, wherein a ratio of a first inductance of the first inductor to a second inductance of the second inductor is approximately 1 to 7.5.

14. The T-coil IC of claim 1, wherein a coupling coefficient k of the T-coil is approximately 0.4.

15. The T-coil IC of claim 1, further comprising an interconnect on a metal x-3-z ($M_{x-3-z}$) layer, where z is greater than or equal to 0, the interconnect being connected to the third inductor core second end by a via stack.

16. A method of operation of a T-coil integrated circuit (IC), comprising:
   flowing a first current through a first inductor core on a metal x ($M_x$) layer, the first inductor core having at least 1⅜ turns, the first inductor core having a first inductor core first end and a first inductor core second end;
   flowing a second current through a second inductor core on a metal x-1 ($M_{x-1}$) layer, the second inductor core having at least 2⅝ turns, the second inductor core having a second inductor core first end and a second inductor core second end, the first inductor core second end being connected to the second inductor core first end at a node;
   flowing a third current through a third inductor core on a metal x-2 ($M_{x-2}$) layer, the third inductor core having at least 3 turns, the third inductor core having a third inductor core first end and a third inductor core second end, the second inductor core second end being connected to the third inductor core first end by a via; and
   flowing a fourth current through a tap on a metal x-3-y ($M_{x-3-y}$) layer, where y is greater than or equal to 0, the tap being connected to the first inductor core and the second inductor core by a via stack at the node, wherein a first inductor is formed by the first inductor core, and a second inductor is formed by the second inductor core and the third inductor core.

17. The method of operation of the T-coil IC of claim 16, wherein the first inductor core as 1⅜ turns, the second inductor core has 2⅝ turns, and the third inductor core has 3 turns.

18. The method of operation of the T-coil IC of claim 16, wherein y is equal to one of 0, 1, 2, or 3.

19. The method of operation of the T-coil IC of claim 16, wherein the $M_x$ layer is a redistribution layer (RDL).

20. The method of operation of the T-coil IC of claim 16, wherein the T-coil IC is on an IC, and the tap is connected to an electrostatic discharge (ESD) device on the IC.

21. The method of operation of the T-coil IC of claim 16, wherein a ratio of a first inductance of the first inductor to a second inductance of the second inductor is approximately 1 to 7.5.

22. The method of operation of the T-coil IC of claim 16, wherein a coupling coefficient k of the T-coil is approximately 0.4.

23. The method of operation of the T-coil IC of claim 16, further comprising flowing a fifth current through an interconnect on a metal x-3-z ($M_{x-3-z}$) layer, where z is greater than or equal to 0, the interconnect being connected to the third inductor core second end by a via stack.

24. A T-coil integrated circuit (IC), comprising:
   means for flowing a first current through a first inductor core on a metal x ($M_x$) layer, the first inductor core having at least 1⅜ turns, the first inductor core having a first inductor core first end and a first inductor core second end;
   means for flowing a second current through a second inductor core on a metal x-1 ($M_{x-1}$) layer, the second inductor core having at least 2⅝ turns, the second inductor core having a second inductor core first end and a second inductor core second end, the first inductor core second end being connected to the second inductor core first end at a node;
   means for flowing a third current through a third inductor core on a metal x-2 ($M_{x-2}$) layer, the third inductor core having at least 3 turns, the third inductor core having a third inductor core first end and a third inductor core second end, the second inductor core second end being connected to the third inductor core first end by a via; and
   means for flowing a fourth current through a tap on a metal x-3-y ($M_{x-3-y}$) layer, where y is greater than or equal to 0, the tap being connected to the first inductor core and the second inductor core by a via stack at the node, wherein a first inductor is formed by the first inductor core, and a second inductor is formed by the second inductor core and the third inductor core.

25. The T-coil IC of claim 24, wherein the first inductor core as 1⅜ turns, the second inductor core has 2⅝ turns, and the third inductor core has 3 turns.

26. The T-coil IC of claim 24, wherein y is equal to one of 0, 1, 2, or 3.

27. The T-coil IC of claim 24, wherein the $M_x$ layer is a redistribution layer (RDL).

28. The T-coil IC of claim 24, wherein the T-coil IC is on an IC, and the tap is connected to an electrostatic discharge (ESD) device on the IC.

29. The T-coil IC of claim 24, wherein a ratio of a first inductance of the first inductor to a second inductance of the second inductor is approximately 1 to 7.5.

30. The T-coil IC of claim 24, further comprising means for flowing a fifth current through an interconnect on a metal x-3-z ($M_{x-3-z}$) layer, where z is greater than or equal to 0, the interconnect being connected to the third inductor core second end by a via stack.

* * * * *